United States Patent

Kumatoriya et al.

[11] Patent Number: 5,871,856
[45] Date of Patent: Feb. 16, 1999

[54] MAGNETOSTATIC WAVE DEVICE

[75] Inventors: Makoto Kumatoriya, Sendai; Takashi Fujii; Hiroshi Takagi, both of Otsu, all of Japan

[73] Assignee: Murata Manufacturing Co., Ltd., Kyoto, Japan

[21] Appl. No.: 786,693

[22] Filed: Jan. 22, 1997

[30] Foreign Application Priority Data

Jan. 22, 1996 [JP] Japan .................................. 8-008662

[51] Int. Cl.$^6$ .................................................. B32B 18/00
[52] U.S. Cl. ........................ 428/700; 428/701; 428/702; 428/900; 331/107 A
[58] Field of Search .................... 428/700, 701, 428/702, 900; 331/107 A

[56] References Cited

U.S. PATENT DOCUMENTS 4,728,178  3/1988  Gualtieri ................................. 350/377
5,198,297  3/1993  Tanno ..................................... 428/336
5,449,942  9/1995  Tanno ..................................... 257/421
5,601,935  2/1997  Fujino .................................... 428/692

Primary Examiner—Timothy M. Speer
Attorney, Agent, or Firm—Ostrolenk, Faber, Gerb & Soffen, LLP

[57] ABSTRACT

Disclosed herein is a magnetostatic wave device that employs a single-crystal thin film of the formula $Y_{3-x}M_xFe_{5-y}N_yO_{12}$ (where M denotes at least one member selected from La, Bi, Lu, and Gd, N denotes at least one member selected from Al, In, and Sc, and x and y are defined as $0<x\leq1.0$ and $0<y\leq1.5$, respectively) which is formed by liquid phase epitaxy on a single-crystal substrate of $Gd_3Ga_5O_{12}$, characterized in that said single-crystal thin film has a lattice constant larger than that of said single-crystal substrate, with the difference ($\Delta a$) between the two lattice constants being in the range defined by $0.0004\text{ nm}\leq\Delta a\leq0.001\text{ nm}$. It has good characteristic properties (e.g., low insertion loss and ripple).

7 Claims, 2 Drawing Sheets

MAGNETOSTATIC WAVE DEVICE

BACKGROUND OF THE INVENTION

1. Field of the Invention

The present invention relates to a magnetostatic wave device which employs a magnetic garnet single-crystal thin film.

2. Description of the Prior Art

Among magnetic materials used for bubble memory and optical isolator is a single-crystal thin film of magnetic garnet which is grown on a substrate of single-crystal garnet by liquid phase epitaxy.

Magnetostatic wave devices employ a spherical magnetic garnet, which is conventionally produced by spherically grinding with high accuracy a single-crystal magnetic garnet (bulk) obtained by the flux technique or floating-zone technique. The spherical grinding has been a bottleneck in mass production.

A recent approach to this situation is to make magnetostatic wave devices from a magnetic garget single-crystal thin film grown on a garnet single-crystal substrate by liquid phase epitaxy. The advantage of liquid phase epitaxy is an ability to give a magnetic garnet single-crystal thin film of high quality which does not need spherical grinding or precision grinding for the fabrication of the magnetic garnet single-crystal bulk into a sphere. The consequence is a simplification of the device structure.

One of the magnetic properties of magnetic garnet single-crystal thin film is saturation magnetization (Is), which is associated with the working frequency of a magnetostatic wave device. Therefore, it is common practice to reduce saturation magnetization for low working frequencies. This is usually accomplished by substituting non-magnetic ions (such as $Ga^{3+}$ and $Al^{3+}$) for part of the $Fe^{3+}$ in $Y_3Fe_5O_{12}$ (which is a typical magnetic garnet). The result of substitution is an increased mismatching of lattice constant between the garnet single-crystal substrate and the magnetic garnet single-crystal thin film grown thereon. This mismatching is due to the difference in their ionic radii. To preserve the crystallographic quality, it is common practice to substitute $La^{3+}$ or $Bi^{3+}$ for part of $Y^{3+}$ in $Y_3Fe_5O_{12}$ and $Sc^{3+}$ for part of $Fe^{3+}$ in $Y_3Fe_5O_{12}$.

The magnetostatic wave device with a conventional magnetic garnet single-crystal thin film formed by liquid phase epitaxy is poor in characteristic properties because of its high insertion loss and its tendency to cause ripples.

OBJECT OF THE INVENTION

It is an object of the present invention to provide a magnetostatic wave device having improved characteristic properties (i.e., low insertion loss and ripple).

DETAILED DESCRIPTION OF THE INVENTION

Figure 1:
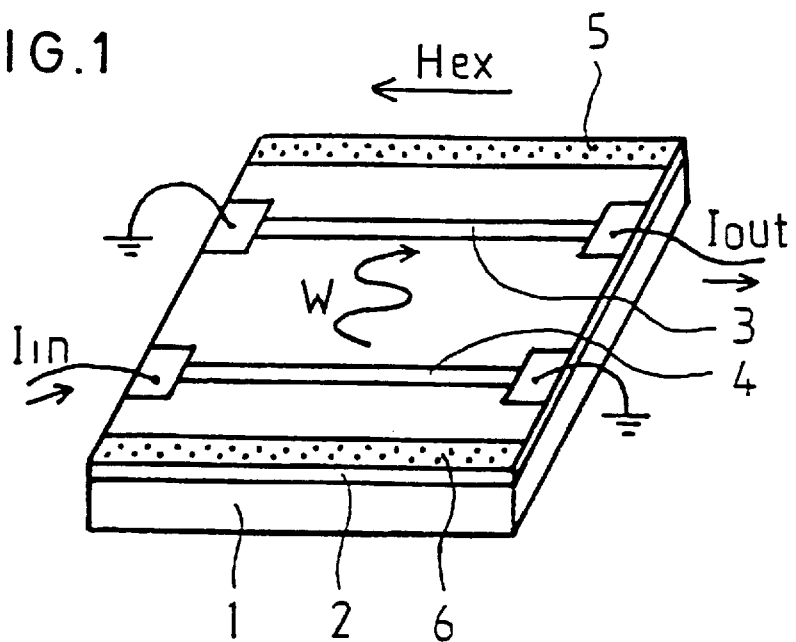
FIG. 1 is a perspective view showing an example of the magnetostatic wave device according to the present invention.

A problem that arises when a thin film of magnetic single-crystal garnet is grown on a substrate of single-crystal garnet (such as $Gd_3Ga_5O_{12}$) by liquid phase epitaxy is that they differ in lattice constant or there is a certain amount of mismatching in lattice constant between them.

In the case of bubble memories and optical isolators that employ a thin film of magnetic single-crystal garnet grown on a substrate of single-crystal garnet, it has been common practice to intentionally increase or decrease the amount of mismatching of lattice constant so as to control the magnetic properties as desired. For example, increasing it generates a stress-induced anisotropic magnetic field due to strain, and decreasing it eliminates the magnetic field.

Since it has generally been believed that a thin film of magnetic garnet single-crystal for magnetostatic wave devices should preferably have a smaller ferromagnetic resonance half-width ($\Delta H$), the present inventors considered at the beginning that this requirement would be met by reducing the amount of mismatching of lattice constant to nearly zero.

Later, they undertook detailed research on the relation between the amount of mismatching of lattice constant and the characteristic properties (such as insertion loss and ripple) of the magnetostatic wave device. As the result, they found that the magnetostatic wave device has improved characteristic properties when there is a particular amount of mismatching in lattice constant rather than when there is almost no mismatching in lattice constant.

This finding has led to the present invention, which covers a magnetostatic wave device that employs a single-crystal thin film of the formula $Y_{3-x}M_xFe_{5-y}N_yO_{12}$ (where M denotes at least one member selected from La, Bi, Lu, and Gd, N denotes at least one member selected from Al, Ga, In and Sc, and x and y are defined as $0<x\leq1.0$ and $0<y\leq1.5$, respectively) which is formed by liquid phase epitaxy on a single-crystal substrate of $Gd_3Ga_5O_{12}$, characterized in that said single-crystal thin film has a lattice constant larger than that of said single-crystal substrate with the difference ($\Delta a$) between the two lattice constants being in the range defined by $0.0004$ nm $\leq \Delta a \leq 0.001$ nm. Preferably, x is about 0.01 to 0.1, y is about 0.25 to 0.75 and $\Delta a$ is about 0.0005 to 0.0009.

The magnetostatic wave device constructed as mentioned above have improved characteristic properties, with a low insertion loss and ripple.

A probable reason for this is the difference $\Delta a$ (or the amount of mismatching) in lattice constant between the single-crystal thin film of magnetic garnet and the single-crystal substrate $Gd_3Ga_5O_{12}$. This difference in lattice constant exerts a compressive stress on the single-crystal substrate, creating a strain in the single-crystal thin film. This strain elongates the crystal lattice of the single-crystal thin film horizontally with respect to the surface of the single-crystal thin film. The effect is that the direction of magnetization of electron spin easily aligns with that of DC magnetic field in the case where a DC magnetic field is applied horizontally to the single-crystal thin film as in the surface magnetostatic wave. The result is a more homogeneous internal magnetic field in the single-crystal thin film.

The present invention requires that the difference ($\Delta a$) of lattice constant be in the range defined by $0.0004$ nm $\leq \Delta a \leq 0.001$ nm for the reasons given in the following.

With $\Delta a$ in excess of about 0.001 nm, the single-crystal thin film has an non-homogeneous anisotropic magnetic field due to strain, which leads to a magnetostatic wave device which fluctuates in characteristic properties. Another disadvantage is that the single-crystal thin film has a greater induced magnetic anisotropy due to strain therein, which hampers operation at low frequencies. In addition, a greater value of $\Delta a$ leads to cracking in the single-crystal thin film.

With Δa smaller than about 0.0004 nm, the single-crystal thin film (used for the magnetostatic wave device) does not produce the effect of reducing insertion loss and ripple. Another disadvantage is that the single-crystal thin film fluctuates in characteristic properties (such as insertion loss and ripple) when used as a magnetostatic wave device in the form of chip cut out of the wafer. Presumably this is due to a small mutual reaction of the single-crystal thin film and the single-crystal substrate.

EXAMPLES

The magnetostatic wave device of the present invention will be explained with reference to the following examples.

Example 1

A platinum crucible placed in a heating oven was filled with $Y_2O_3$ (0.39 mol %), $Fe_2O_3$ (9.17 mol %), $La_2O_3$ (0.07 mol %), $Ga_2O_3$ (0.37 mol %), PbO (84.00 mol %) and $B_2O_3$ (6.00 mol %). The first four members are oxides of elements constituting the magnetic garnet, and the last two members function as a flux. The raw materials were homogenized by melting at about 1200° C. The melt was cooled to and kept at about 880°–900° C. so that the melt for magnetic garnet became supersaturated.

Into this melt was dipped a substrate of single crystal $Ga_3Gd_5O_{12}$ having the (111) plane. Thus there was obtained a thin film (20-μm thick) of magnetic garnet single crystal having the intended compositional formula $Y_{2.95}La_{0.05}Fe_{4.55}Ga_{0.45}O_{12}$.

The thus obtained single-crystal film was found to have saturation magnetization (Is) of 0.125 $Wb/m^2$ and ferromagnetic resonance half-width (ΔH) of 53.5 A/m. The difference (Δa) (or the amount of mismatching) of lattice constant between the single-crystal film and the single-crystal substrate was 0.0005 nm, according to measurements by the X-ray rocking curve method (with a double crystal spectrometer).

Figure 2:
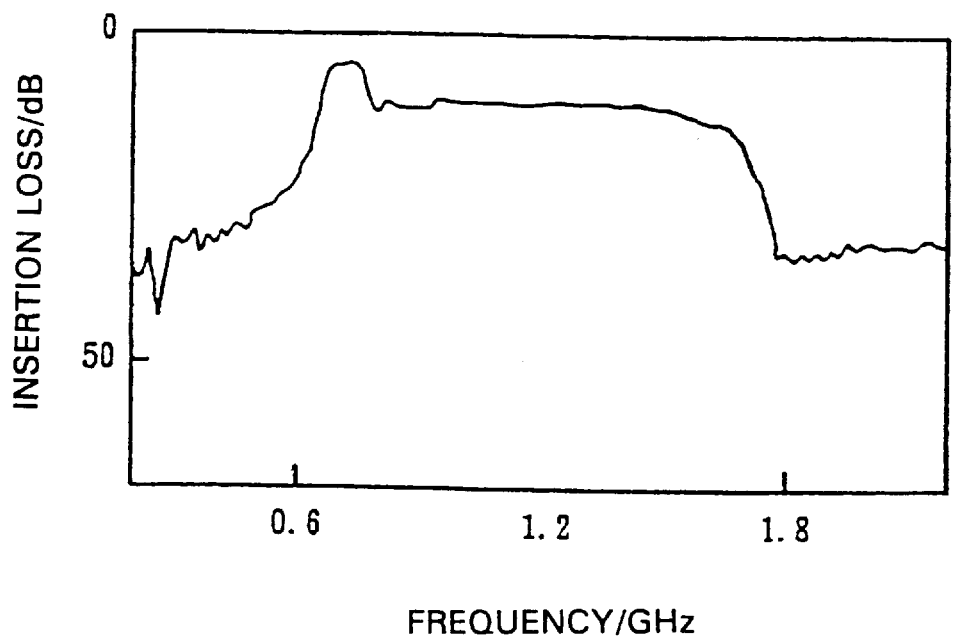
FIG. 2 is a diagram showing the filter characteristics of the magnetostatic wave device in Example 1.

FIG. 1 shows a surface magnetostatic wave device (in the form of a square chip measuring 4 mm by 4 mm cut out of the above-mentioned coated substrate) consisting of a single-crystal substrate (1), a magnetic garnet single-crystal thin film (2), and two transducers (3,4), each 50 μm wide, 2 mm apart, formed from aluminum by vacuum deposition. The device was tested for filter characteristics by application of a DC magnetic field ($H_{ex}$) of 4475 A/m in the direction parallel to the film surface and the transducers. The results are shown in FIG. 2.

In FIG. 1, reference numerals 5 and 6 denote the absorber of magnetostatic wave, $I_{in}$ denotes the direction of input of the microwave, W denotes the direction of propagation of the surface wave (MSSW) and $I_{out}$ denotes the direction of output of the microwave.

Example 2

A platinum crucible placed in a heating oven was filled with $Y_2O_3$ (0.38 mol %), $Fe_2O_3$ (9.17 mol %), $La_2O_3$ (0.08 mol %), $Ga_2O_3$ (0.37 mol %), PbO (84.00 mol %) and $B_2O_3$ (6.00 mol %). The first four members are oxides of elements constituting the magnetic garnet, and the last two members function as a flux. The raw materials were homogenized by melting at about 1200° C. The melt was cooled to and kept at about 880°–900° C. so that the melt for magnetic garnet became supersaturated.

Into this melt was dipped a substrate of single crystal $Ga_3Gd_5O_{12}$ having the (111) plane in the same manner as in Example 1. Thus there was obtained a thin film (20-μm thick) of magnetic garnet single crystal having the intended compositional formula $Y_{2.95}La_{0.05}Fe_{4.55}Ga_{0.45}O_{12}$.

The thus obtained single-crystal film was found to have saturation magnetization (Is) of 0.125 $Wb/m^2$ and ferromagnetic resonance half-width (ΔH) of 62.0 A/m. The difference (Δa) (or the amount of mismatching) of lattice constant between the single-crystal film and the single-crystal substrate was 0.0009 nm, measured in the same manner as in Example 1.

Figure 3:
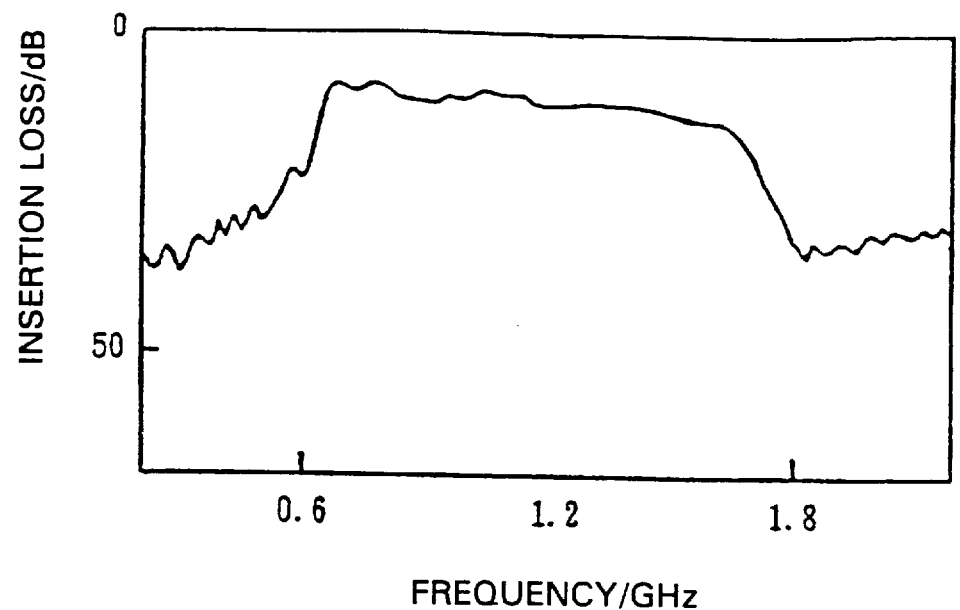
FIG. 3 is a diagram showing the filter characteristics of the magnetostatic wave device in Example 2.

A surface magnetostatic wave device was prepared in the same manner as in Example 1. It was tested for filter characteristics. The results are shown in FIG. 3.

Comparative Example

A platinum crucible placed in a heating oven was filled with $Y_2O_3$ (0.41 mol %), $Fe_2O_3$ (9.17 mol %), $La_2O_3$ (0.05 mol %), $Ga_2O_3$ (0.37 mol %), PbO (84.00 mol %) and $B_2O_3$ (6.00 mol %). The first four members are oxides of elements constituting the magnetic garnet, and the last two members function as a flux. The raw materials were homogenized by melting at about 1200° C. The melt was cooled to and kept at about 880°–900° C. so that the melt for magnetic garnet became supersaturated.

Into this melt was dipped a substrate of single crystal $Ga_3Gd_5O_{12}$ having the (111) plane in the same manner as in Example 1. Thus there was obtained a thin film (20-μm thick) of magnetic garnet single crystal having the intended compositional formula $Y_{2.95}La_{0.05}Fe_{4.55}Ga_{0.45}O_{12}$.

The thus obtained single-crystal film was found to have saturation magnetization (Is) of 0.123 $Wb/m^2$ and ferromagnetic resonance half-width (ΔH) of 87.5 A/m. The difference (Δa) (or the amount of mismatching) of lattice constant between the single-crystal film and the single-crystal substrate was −0.0003 nm, measured in the same manner as in Example 1.

A surface magnetostatic wave device was prepared in the same manner as in Example 1. It was tested for filter characteristics. The results are shown in FIG. 4.

Figure 4:
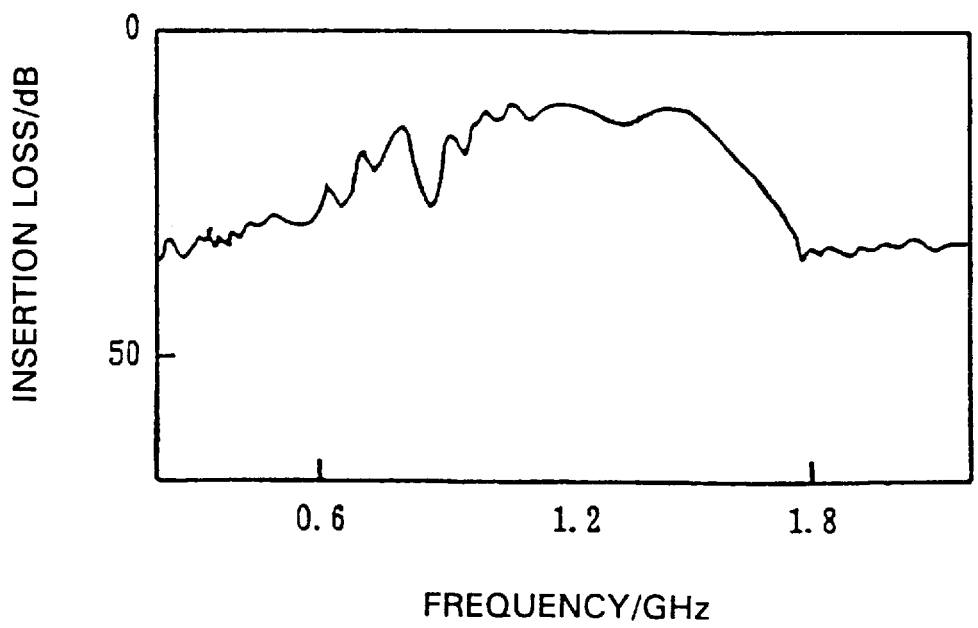
FIG. 4 is a diagram showing the filter characteristics of the magnetostatic wave device in Comparative Example.

It is apparent from FIGS. 2 to 4 that the magnetostatic wave devices in Examples 1 and 2 are superior to that in the Comparative Example in filter characteristics (low insertion loss and ripple).

The above-mentioned examples may be modified to give the desired magnetostatic wave device by changing the compositional formula of magnetic garnet single-crystal thin film from $Y_{2.95}La_{0.05}Fe_{4.55}Ga_{0.45}O_{12}$ to any one represented by $Y_{3-x}M_xFe_{5-y}N_yO_{12}$ (where M denotes at least one member selected from La, Bi, Lu, and Gd, and N denotes at least one member selected from Ga, Al, In, and Sc), such as $Y_{2.78}La_{0.02}Bi_{0.20}Fe_{4.50}Ga_{0.50}O_{12}$ and $Y_{2.85}Bi_{0.15}Fe_{4.30}Sc_{0.10}Ga_{0.60}O_{12}$, so long as the lattice constant of the single-crystal thin film is larger than that of the single-crystal substrate and their difference (Δa) is in the range defined by 0.0004 nm≦Δa≦0.001 nm.

It has been shown in the foregoing that the present invention provides a magnetostatic wave device having good characteristic properties (low insertion loss and ripple) if the thin film of magnetic garnet single crystal is formed on the substrate of single crystal of $Gd_3Ga_5O_{12}$ such that the difference (Δa) in lattice constant between the single-crystal thin film and the singe-crystal substrate is in the range defined by 0.0004 nm≦Δa≦0.001 nm.

What is claimed is:

1. A magnetostatic wave device comprising a liquid phase epitaxy single-crystal thin film of the formula $Y_{3-x}M_xFe_{5-}$ $_yN_yO_{12}$ in which M denotes at least one member selected from the group consisting of La, Lu and Gd, N denotes at least one member selected from the group consisting of Al, Ga, In and Sc, $0<x\leq1.0$ and $0<y\leq1.5$, on a single-crystal $Gd_3Ga_5O_{12}$ substrate, characterized in that said single-crystal thin film has a lattice constant larger than that of said single-crystal substrate and the difference ($\Delta a$) between the two lattice constants is about 0.0004 nm to 0.001 nm.

2. A magnetostatic wave device according to claim 1 in which the difference ($\Delta a$) between the two lattice constants is about 0.0005 nm to 0.0009 nm.

3. A magnetostatic wave device according to claim 2 in which x is about 0.01 to 0.1 and y is about 0.25 to 0.75.

4. A magnetostatic wave device according to claim 3 in which M is La and N is Ga.

5. A magnetostatic wave device according to claim 2 in which M is La and N is Ga.

6. A magnetostatic wave device according to claim 1 in which M is La and N is Ga.

7. A magnetostatic wave device according to claim 1 in which x is about 0.01 to 0.1 and y is about 0.25 to 0.75.

\* \* \* \* \*